(12) United States Patent
Weixler et al.

(10) Patent No.: US 12,744,364 B2
(45) Date of Patent: Sep. 22, 2026

(54) CONTROL HOUSING SYSTEM AND SELF-DRIVING VEHICLE HAVING A CONTROL HOUSING SYSTEM

(71) Applicant: KUKA Deutschland GmbH, Augsburg (DE)

(72) Inventors: Andreas Weixler, Schwabmuenchen (DE); Simon Feuerer, Augsburg (DE)

(73) Assignee: KUKA Deutschland GmbH (DE)

( * ) Notice: Subject to any disclaimer, the term of this patent is extended or adjusted under 35 U.S.C. 154(b) by 415 days.

(21) Appl. No.: 18/683,010

(22) PCT Filed: Aug. 4, 2022

(86) PCT No.: PCT/EP2022/071921

§ 371 (c)(1),
(2) Date: Feb. 12, 2024

(87) PCT Pub. No.: WO2023/016906

PCT Pub. Date: Feb. 16, 2023

(65) Prior Publication Data

US 2024/0372296 A1 Nov. 7, 2024

(30) Foreign Application Priority Data

Aug. 10, 2021 (DE) ..................... 10 2021 120 711.8

(51) Int. Cl.
*H02B 1/36* (2006.01)
*H01R 13/629* (2006.01)
(Continued)

(52) U.S. Cl.
CPC ............. *H02B 1/36* (2013.01); *H01R 13/629* (2013.01); *H02B 1/0565* (2013.01); *H05K 7/14* (2013.01); *H05K 5/069* (2013.01); *H05K 7/10* (2013.01)

(58) Field of Classification Search
None
See application file for complete search history.

(56) References Cited

U.S. PATENT DOCUMENTS 7,525,809 B2 * 4/2009 Bergmann ............... H02B 1/21 361/752
11,845,504 B2 * 12/2023 Xin ........................ B62D 65/04
(Continued)

FOREIGN PATENT DOCUMENTS

DE 3038074 A1 5/1982
DE 3633800 A1 4/1988
(Continued)

OTHER PUBLICATIONS

German Patent Office; Search report in related German Patent Application No. 10 2021 120 711.8 dated May 23, 2022; 6 pages.
(Continued)

*Primary Examiner* — Courtney L Smith
(74) *Attorney, Agent, or Firm* — Dorton & Willis, LLP

(57) ABSTRACT

A control housing system includes at least one control sub-housing having at least one housing rear wall, which supports at least one electrical connector; a slide-in module support; and an interface chamber, which is mechanically connected to the slide-in module support and which has at least one cable feedthrough device. When the control sub-housing is in a position coupled to the slide-in module support, the at least one electrical connector is connected to a corresponding mating electrical connector of the interface chamber. The housing rear wall of the control sub-housing is seated sealingly against a peripheral seal device of a coupling wall of the interface chamber.

10 Claims, 5 Drawing Sheets

(51) Int. Cl.

| | |
|---|---|
| ***H02B 1/056*** | (2006.01) |
| ***H05K 7/14*** | (2006.01) |
| *H05K 5/06* | (2006.01) |
| *H05K 7/10* | (2006.01) |

(56) References Cited

U.S. PATENT DOCUMENTS

| | | | | |
|---|---|---|---|---|
| 11,856,731 | B2 * | 12/2023 | Myhre | H05K 7/209 |
| 2009/0225500 | A1 * | 9/2009 | Cherney | H05K 7/1411<br>361/622 |
| 2018/0022405 | A1 * | 1/2018 | Gecchelin | B62D 47/006<br>701/23 |
| 2018/0241090 | A1 * | 8/2018 | Takami | H01M 50/213 |
| 2019/0353506 | A1 * | 11/2019 | Yoda | G01P 1/023 |

FOREIGN PATENT DOCUMENTS

| | | | | |
|---|---|---|---|---|
| DE | 4223935 | A1 | 1/1994 | |
| EP | 0049517 | A2 * | 4/1982 | H05K 7/1421 |
| EP | 3324266 | A1 | 5/2018 | |

OTHER PUBLICATIONS

European Patent Office; Search Report in related International Patent Application No. PCT/EP2022/071921 dated Nov. 17, 2022; 4 pages.

* cited by examiner

CONTROL HOUSING SYSTEM AND SELF-DRIVING VEHICLE HAVING A CONTROL HOUSING SYSTEM

CROSS-REFERENCE TO RELATED APPLICATIONS

This application is a national phase application under 35 U.S.C. § 371 of International Patent Application No. PCT/EP2022/071921, filed Aug. 4, 2022 (pending), which claims the benefit of priority to German Patent Application No. DE 10 2021 120 711.8, filed Aug. 10, 2021, the disclosures of which are incorporated by reference herein in their entirety.

TECHNICAL FIELD

The invention relates to a control housing system, and to a self-driving vehicle with such a control housing system.

BACKGROUND

EP 3 324 266 A1 describes a device for controlling and operating an autonomous vehicle, wherein the device comprises a chassis which contains a plurality of compartments including a control server compartment, a computing server compartment, and an input and output (IO) subsystem compartment, as well as an IO subsystem which is inserted into the IO subsystem compartment, wherein the IO subsystem has a plurality of IO modules and at least some of the IO modules are coupled to one or more sensors, a computing server that is inserted into the computing server compartment, wherein the computing server receives the sensor data from the IO subsystem via a plurality of PCIe interfaces and generates planning and control data as a function of sensor data to control the autonomous vehicle, and a control server that is inserted in the control server compartment and is connected to the computing server via an Ethernet connection, wherein the control server controls and operates the autonomous vehicle by sending a plurality of control commands to the hardware of the autonomous vehicle based upon the planning and control data received from the computing server.

SUMMARY

The object of the invention is to create a control housing system which can be used in rough working environments, but at least one control component can nevertheless be easily removed, inserted, and/or replaced for service and repair purposes.

The object is achieved by a control housing system having:

- at least one control sub-housing having at least one housing rear wall which supports at least one electrical connector,
- a slide-in module support with a guide device designed to mechanically guide the control sub-housing, which guides the control sub-housing between a decoupled position on the slide-in module support, in which the at least one electrical connector is unplugged, and a coupled position on the slide-in module support in which the at least one electrical connector is plugged in, and
- an interface chamber mechanically connected to the slide-in module support, and which has
- at least one cable feedthrough device,
- at least one coupling wall, facing the housing rear wall of the at least one control sub-housing, which has a circumferential seal device, within the circumference of which at least one electrical mating connector of the interface chamber corresponding to the electrical connector of the control sub-housing is positioned, and
- has a mounting opening which can be closed in a sealing manner by a cover and via which, when the cover is removed, an interior of the interface chamber is accessible, wherein,
- in the position of the control sub-housing in which it is coupled to the slide-in module support, the at least one electrical connector is plugged into the corresponding electrical mating connector of the interface chamber, and the housing rear wall of the control sub-housing is seated sealingly against the peripheral seal device of the coupling wall of the interface chamber.

The control housing system comprises, as system components, at least the slide-in module support, the interface chamber, and at least one control sub-housing that is mechanically and electrically separable from the slide-in module support and the interface chamber. In this respect, a control sub-housing is considered to be an independent housing which is a subcomponent of the overall housing of the control housing system. In a simplified minimum configuration, only a single separable control sub-housing can, optionally, be provided. However, the special advantages preferably result, in a particularly sensible manner, when two control sub-housings are provided, or even more than two control sub-housings are provided. All existing control sub-housings need not necessarily be designed to be separable both mechanically and electrically from the slide-in module support and the interface chamber. Rather, depending upon the circumstances of the individual case, the object is already achieved if only a smaller number of control sub-housings than the number of all the existing control sub-housings are designed to be separable both mechanically and electrically from the slide-in module support and the interface chamber.

However, each existing control sub-housing is protected, considered on its own, against ingress of foreign bodies—specifically with a protection class that is at least necessary for the intended application. In addition, the interface chamber, considered on its own, is also protected against ingress of foreign bodies, viz., with a protection class that is at least necessary for the intended application.

In the control housing system according to the invention, accordingly, all existing control sub-housings and also the interface chamber, which in each case contain electrical and/or electronic components, are protected, depending upon the application environment and the operating conditions prevailing there, from the ingress of foreign bodies, e.g., stones, sand, dust, other dirt, gases, vapors, or possibly also water, in order, for example, to prevent a failure of the electrical and/or electronic components and to minimize a wear—for example, due to corrosion. For the standardized definition of necessary degrees of protection for the respective intended application, IP degrees of protection are subdivided into group classifications that are defined in relevant standards. Examples of relevant standards are, for example, ISO 20898, ISO 20653, NFPA 79, EN 60529, EN 60204-1, or EN1175-1. Depending upon the applicable standard and required protection class, the corresponding seal devices in the control housing system according to the invention can be designed differently depending upon the application.

Each control sub-housing has a housing rear wall on which the at least one electrical connector is arranged. In this context, the housing wall or the housing wall section of the control sub-housing is referred to as the housing rear wall, which faces the interface chamber when the control sub-housing on the slide-in module is in the coupled position. The rear housing wall can have a single electrical connector. Alternatively, the housing rear wall can have two or more electrical connectors. In this respect, each electrical connector is also an electromechanical connector, and each mating connector is also an electromechanical connector. Electrical energy in the form of electrical power and/or in the form of data or information can be transmitted or exchanged via a connection of the electrical connector and corresponding mating connector. A mating connector is designed to correspond to the connector if the mating connector and plug connector can be mechanically coupled—in particular, plugged together—in accordance with the plug/socket principle, so that they can also interact electrically in a plugged state in order to create the desired electrical connection. It is initially immaterial whether the mating connector is designed as a plug or a socket or the connector is designed as a plug or a socket. Embodiments can also be provided in which the mating connector and the connector each have both plug elements and socket elements, provided that these are designed to engage in one another in a corresponding manner.

Optionally, the connector can have single, multiple, or any combination of electrical plugs, electrical sockets, and/or electrical couplings. Accordingly, the mating connector, correspondingly designed in a complementary manner, of the interface chamber can also have individual, multiple, or any combination of electrical plugs, electrical sockets, and/or electrical couplings.

The electro-mechanical plug-in connection formed by the at least one connector of the control sub-housing and the at least one mating connector of the interface chamber is designed to be detachable, so that a control sub-housing coupled to the interface chamber, i.e., plugged in, can be manually pulled off the interface chamber and removed from the slide-in module carrier. The electromechanical plug connection is provided for the purpose of allowing electrical energy, control signals, data, and/or information to be transmitted—in particular, sent and/or received or exchanged—between an electronic control or drive control system or drive amplifiers present in the control sub-housing and another electrical system or another electronic control or drive control system or drive amplifiers in another control sub-housing.

In an expedient and therefore frequent application, a first control sub-housing can, for example, contain an electronic control device, which can, for example, be a drive control and/or navigation control of a self-driving vehicle or a robot control, wherein the control housing system additionally has at least one second control sub-housing which contains a drive control and/or at least drive amplifiers which are designed to convert the drive commands provided by the drive control and/or by the navigation control or by the robot control into a drive power, by means of which the corresponding drive or drive motors of the wheels of the self-driving vehicle or drive motors of joints of a robot kinematic system are driven.

The electro-mechanical plug connection formed by the at least one connector of the control sub-housing and the at least one mating connector of the interface chamber can be used not only to exchange electrical energy and/or electrical control signals, data, and/or information between electronic control devices or drive control and/or drive amplifiers of two or more different control sub-housings, but also to exchange electrical energy and/or electrical control signals, data, and/or information between a respective system in a control sub-housing of the control housing system and another electrical or electronic system outside the control housing system according to the invention. Accordingly, external control modules and/or sensors, e.g., of a self-driving vehicle, can also be connected by the control housing system via the electromechanical plug connection—in particular, indirectly via electrical line sections of at least one electrical line fed via a cable feed-through device and/or via at least one electrical connection cable that electrically connects at least one industrial connector of the interface chamber to the mating connector of the interface chamber.

The slide-in module support itself can either be designed as a separate closed housing or, as shown in the case of the embodiment, as an open frame or carrier. Since both the at least one control sub-housing and the interface chamber are designed to be sealed with the specific protection class according to the respective requirements, a closed design of the slide-in module support is basically unnecessary. The slide-in module support can therefore be designed correspondingly simple—in particular, can be designed to be reduced to its essential function as a holder and guide for the at least one control sub-housing.

However, the interface chamber is connected to the slide-in module support—in particular, firmly or rigidly connected. A firm or rigid connection of the interface chamber in relation to the slide-in module support ensures a very precise relative location and position of the control sub-housing to be inserted or plugged in, i.e., to be coupled to the interface chamber. To adapt to minor position deviations, which can occur, for example, due to manufacturing tolerances or assembly tolerances between the mating connector of the interface chamber and the connector of the control sub-housing, the electrical mating connector of the interface chamber can be adjustably mounted relative to the coupling wall in a plane parallel to the coupling wall, so that such manufacturing tolerances or assembly tolerances can be compensated for even though the interface chamber is connected firmly or rigidly to the slide-in module support. Alternatively, however, it is possible to adjustably mount the entire interface chamber in a plane parallel to the coupling wall, instead of to adjustably mount just the electrical mating connector of the interface chamber relative to the coupling wall in a plane parallel to the coupling wall.

In the simplest case, the guide device can be formed by straight rails or angle strips onto which the respective control sub-housing is set up or placed and on which the control sub-housing is linearly displaceable, viz., in the plug-in direction of connectors of the control sub-housing and mating connectors of the interface chamber. The at least one control sub-housing is thus displaceably mounted on the at least one rail or angled strip at least between a decoupled position on the slide-in module support, in which the at least one electrical plug connector is unplugged from the corresponding mating connector of the interface chamber, and a coupled position on the slide-in module support, in which the at least one electrical plug connector is plugged into the corresponding mating connector of the interface chamber.

The interface chamber has at least one cable feedthrough device. Via the at least one cable feedthrough device, electrical line sections are led from outside the interface chamber into the interior of the interface chamber, or an electrical line is connected in order to electrically connect the respective electrical line to at least one connecting cable arranged in the interior of the interface chamber. By means of the respective lines, the components, devices, or sensors present outside the control housing system can be electrically connected to the electronic control devices or drive controls and/or drive amplifiers of the control sub-housing. Depending upon the application and depending upon the applicable standard and required protection class, the cable feedthrough device is correspondingly sealed so that no foreign bodies, such as stones, sand, dust, other dirt, gases, vapors, or possibly also water can reach the interior of the interface chamber from outside the interface chamber via the cable feedthrough device.

The interface chamber has a mounting opening which can be closed in a sealing manner by a cover and via which, when the cover is removed, the interior of the interface chamber is accessible. The interface chamber accordingly therefore comprises at least one cover. The cover can be fastened to the interface chamber in a completely detachable manner, e.g., by means of a plurality of screws arranged distributed over the circumference, which engage in threaded bores in a side wall of the interface chamber when the cover is screwed tight to the interface chamber. Alternatively, to complete detachability of the cover from the interface chamber, the cover can also be mounted adjustably—in particular, displaceably or pivotably—in the manner of a flap or a door, so that, although the cover cannot be completely removed from the interface chamber, it is, however, mounted adjustably on the interface chamber at least between an open position releasing the mounting opening and a sealing closed position sealing the mounting opening. In the closed position of the cover or the flap or the door, depending upon the application and depending upon the applicable standard and required protection class, it is correspondingly sealed so that no foreign bodies, such as stones, sand, dust, other dirt, gases, vapors, or possibly also water can reach the interior of the interface chamber from outside the interface chamber via mounting opening. The mounting opening primarily serves to be able to configure the line sections fed into the interior of the interface chamber and/or the connection cables, i.e., to be able to connect them electrically to the desired mating connectors of the interface chamber—in particular, plug them in, unplug them, or reconnect them. Via the mounting opening, the mating connectors themselves can also be reconfigured, removed, inserted, or replaced, and optionally also replaced by dummy plugs or sealed covers, if a respective mating connector or a respective cable feedthrough device is not required at the relevant position.

Since the at least one coupling wall facing the housing rear wall of the at least one control sub-housing has a circumferential seal device, within the circumference of which the at least one electrical mating connector of the interface chamber is positioned, in the position of the control sub-housing, in which it is coupled to the slide-in module support, in which the at least one electrical connector is plugged into the corresponding electrical mating connector of the interface chamber, the housing rear wall of the control sub-housing rests sealingly against the circumferential seal device of the coupling wall of the interface chamber. A control housing system is thus created which can be used in rough working environments, but the at least one control sub-housing can nevertheless be easily removed, inserted, and/or replaced for service and repair purposes. A particular advantage is that, even when the control sub-housing is in an unplugged state, both the control sub-housing itself as well as the interface chamber considered by itself always remain sealed in the correspondingly designed protection class and retain their respective sealing protective effect, which prevents foreign bodies such as for example stones, sand, dust, other dirt, gases, vapors, or optionally water from outside the interface chamber from entering the interior of the interface chamber or from outside the control sub-housing into the interior of the control sub-housing.

The sealing device, which has a sealing effect in the combination of a seal with a seal seating surface, is designed to seal a gap between the control sub-housing and the interface chamber when the control sub-housing is in its coupled position on the slide-in module support, so that no foreign bodies—in particular, no stones, sand, dust, other dirt, gases, vapors, or possibly also water, depending upon the required IP protection class (ingress protection)—can enter the electrical plug-in connection of the control sub-housing and the mating connector of the interface chamber.

In a first embodiment, the seal device of the coupling wall of the interface chamber can comprise a seal attached to the coupling wall, which is arranged in an edge region of an opening of the coupling wall, wherein the mating connector of the interface chamber for inserting the electrical plug connector of the control sub-housing into the mating connector of the interface chamber is accessible through the opening, and the housing rear wall of the control sub-housing has a sealing seat surface cooperating with the seal of the coupling wall in the coupled position of the control sub-housing.

Depending upon the size of the at least one mating connector and the number of mating connectors, the opening of the coupling wall is dimensioned such that all provided mating connectors are accessible via the opening. In this respect, the seal device of the coupling wall surrounds the at least one mating connector individually, or the plurality of mating connectors jointly.

The mating connector of the interface chamber for inserting the electrical connector of the control sub-housing into the mating connector of the interface chamber is accessible through the opening. The opening in the coupling wall of the interface chamber is therefore only to be understood to mean that the connector of the control sub-housing can be plugged into the mating connector of the interface chamber. However, the opening can be permanently closed by the at least one mating connector, viz., in a manner which corresponds to the desired or required protection class, in order to prevent foreign bodies, such as stones, sand, dust, other dirt, gases, vapors, or possibly also water, from penetrating into the interface chamber. This can even be provided in such a way if the at least one mating connector is adjustably mounted relative to the coupling wall in a plane parallel to the coupling wall. In such a case, the mating connector can be sealed against the coupling wall by means of a dynamic seal.

The seal attached to the coupling wall can be a static flat seal, for example. The seal can have a shape adapted to the shape of the opening and accordingly encloses the edge region of the opening in a frame-like manner. The seal can be made of an elastic material which bridges a gap between the coupling wall of the interface chamber and the housing rear wall of the associated control sub-housing in the coupled position of the control sub-housing.

In an alternative second embodiment, the seal device of the coupling wall of the interface chamber can comprise a sealing seat surface formed at the coupling wall, which is arranged in an edge region of an opening of the coupling wall, wherein the mating connector of the interface chamber for inserting the electrical plug connector of the control sub-housing into the mating connector of the interface chamber is accessible through the opening, and the housing rear wall of the control sub-housing has a seal cooperating with the sealing seat surface of the coupling wall in the coupled position of the control sub-housing.

Depending upon the size of the at least one mating connector and the number of mating connectors, the opening of the coupling wall is dimensioned in this case as well such that all provided mating connectors are accessible via the opening. In this respect, the sealing seat surface of the coupling wall surrounds the at least one mating connector individually, or the plurality of mating connectors jointly.

The mating connector of the interface chamber for inserting the electrical connector of the control sub-housing into the mating connector of the interface chamber is accessible through the opening. In this case as well, the opening in the coupling wall of the interface chamber is therefore only to be understood to mean that the connector of the control sub-housing can be plugged into the mating connector of the interface chamber. However, the opening can be permanently closed by the at least one mating connector, viz., in a manner which corresponds to the desired or required protection class, in order to prevent foreign bodies, such as stones, sand, dust, other dirt, gases, vapors, or possibly also water, from penetrating into the interface chamber. This can even be provided in such a way if the at least one mating connector is adjustably mounted relative to the coupling wall in a plane parallel to the coupling wall. In such a case, the mating connector can be sealed against the coupling wall by means of a dynamic seal.

In the second embodiment, the seal now attached to the housing rear wall of the control sub-housing can also be a static flat seal. The seal can have a shape adapted to the shape of the opening in the coupling wall of the interface chamber or to the shape of the sealing seat surface at the coupling wall of the interface chamber, and accordingly encloses the edge region of the opening in a frame-like manner. The seal can be made of an elastic material which bridges a gap between the coupling wall of the interface chamber and the housing rear wall of the associated control sub-housing in the coupled position of the control sub-housing.

In all embodiments, the electrical mating connector of the interface chamber can be adjustably mounted relative to the coupling wall in a plane parallel to the coupling wall.

The opening in the coupling wall of the interface chamber can accordingly be permanently closed by the at least one mating connector even if the at least one mating connector is mounted in an adjustable position, viz., in a manner which corresponds to the desired or required protection class, in order to prevent foreign bodies, such as stones, sand, dust, other dirt, gases, vapors, or possibly also water, from penetrating into the interface chamber. The mating connector can be sealed against the coupling wall by means of a dynamic seal, for example.

In general, the guide device can comprise at least one rail, on which the control sub-housing is mounted for linear displacement in a direction perpendicular to the plane of the coupling wall of the interface chamber between the decoupled position on the slide-in module support, in which the at least one electrical connector is unplugged, and the coupled position on the slide-in module support, in which the at least one electrical connector is plugged into the mating connector.

The at least one rail can be designed to be straight and in particular can be formed by at least one angle strip onto which the respective control sub-housing is set up or placed and on which the control sub-housing is linearly displaceable, viz., in the plug-in direction of connectors of the control sub-housing and mating connectors of the interface chamber. The at least one control sub-housing is thus displaceably mounted on the at least one rail or angled strip at least between a decoupled position on the slide-in module support, in which the at least one electrical plug connector is unplugged from the corresponding mating connector of the interface chamber, and a coupled position on the slide-in module support, in which the at least one electrical plug connector is plugged into the corresponding mating connector of the interface chamber.

The slide-in module support can have at least one clamping means, which is designed to fix the control sub-housing in its coupled position on the slide-in module support, in which the electrical connector of the control sub-housing is plugged into the mating connector of the interface chamber, and/or to clamp it tight by pressing against the seal and/or the seal seat surface in the direction of insertion.

The clamping means can have a pressing device which is arranged on a housing front wall of the control sub-housing opposite the housing rear wall of the control sub-housing and is supported on a section of the slide-in module carrier there. In the simplest case, a tab can be fastened upstream of the front wall of the housing of the control sub-housing and has a threaded hole in which a screw aligned perpendicular to the plane of the housing rear wall of the control sub-housing or perpendicular to the plane of the coupling wall of the interface chamber is screwed. The thread-side end face of the screw can press directly and indirectly against the housing front wall of the control sub-housing via interposed spacers or clamps when the screw is screwed in. By screwing in the screw, the control sub-housing is guided on the guide device of the slide-in module support with its housing rear wall pressed or pretensioned against the coupling wall of the interface chamber.

The slide-in module support can have damping bodies by means of which the slide-in module support can be mounted in a vibration-dampened manner on a frame or a chassis—for example, of a vehicle. For this purpose, support arms or support brackets can be formed on the slide-in module support, which have support sections which comprise the downwardly facing seat surfaces on which an elastic damping body is fastened in each case. In an installed state of the slide-in module support in the device or the machine, such as for example the vehicle, the undersides of the elastic damping bodies lie on support surfaces of the frame or the chassis of the device or the machine, such as for example the vehicle, wherein the slide-in module support in this respect rests on the elastic damping bodies. By means of the elastic damping bodies, the entire control housing system is thus at least largely decoupled from the device or from the machine—in particular, from the vehicle with respect to oscillations or vibrations and/or impacts.

The cable feedthrough device can have at least one cable gland device and/or at least one industrial connector.

The at least one cable gland device can have a divisible or one-piece frame in which one or more slotted sealing bodies are inserted, wherein each sealing body sealingly receives an electrical line or an electrical cable, in that the sealing body sealingly surrounds the casing of the line.

When cable gland devices are used, the electrical lines can already be prefabricated with plugs before they are inserted into the interface chamber. The advantage of divisibility of the frame is that, on the one hand, removing plugs from the line and the reassembling plugs on the line can be dispensed with and, on the other, the line can also be run into the interface chamber afterwards, since the cable gland device can be mounted around the lines.

These cable gland devices with a divided frame comprise, for example, a frame made of hard plastic and one or more slotted sealing bodies which can consist of elastomer plastic. The line inserted into the interface chamber via the cable gland devices is firmly enclosed by this sealing body and fixed in the frame of hard plastic. A desired or required sealing effect and possibly also a strain relief can be achieved by means of the sealing body.

Alternatively to cable gland devices with a divisible frame, a single-piece frame made of hard plastic can also be provided. Such frames can, for example, be divided into a plurality of differently dimensioned through-openings with insertable or permanently molded-on partition walls. Suitable sealing bodies can then be inserted individually into these through-openings. In contrast to cable glands with a divisible frame in which all sealing bodies have to be held together for being fixed, the frame subdivision, by means of partition walls, also enables individual sealing elements or lines to be replaced. The partition walls can also be rearranged without removing the one-piece frame if this is desired. The laterally slotted sealing bodies can be inserted from the inside of the housing into the windows of the frame divided by the partition walls, for example, after they have been fitted onto the casing of the line. Unprotected, solid sealing bodies can be used to close unused frame openings, i.e., windows.

Alternatively or in addition to cable gland devices, at least one industrial connector can also be provided.

The industrial connector can have a plug housing which is tightly fastened to the interface chamber and in which a plug carrier, a socket carrier, or a hybrid carrier (mixed plugs and sockets) is fastened, wherein corresponding electrical plug inserts and/or electrical socket inserts, which have the assembled electrical plug pins and/or electrical socket pins, are inserted in the plug carrier, the socket carrier, or the hybrid carrier.

The interface chamber can have a dust-tight and/or liquid-tight interior in which electrical line sections of at least one electrical line fed through a cable feedthrough and/or at least one electrical connection cable which electrically connects at least one industrial connector to the mating connector are arranged.

The electrical line sections, which are inserted in a sealed manner into the interior of the interface chamber and which are already fitted with plugs and/or sockets on the inside at the ends, or separate electrical connection cables can then be electrically contacted or plugged into the mating connectors on the coupling wall of the interface chamber as desired.

The control housing system can have at least one first control sub-housing with at least one first housing rear wall which carries at least one first electrical connector, wherein the first control sub-housing contains an electronic control device, and the control housing system can have at least one second control sub-housing with at least one second housing rear wall, which carries at least one second electrical connector, wherein the second control sub-housing contains a drive amplifier of a drive control.

In this specific embodiment, the first control sub-housing contains an electronic control device, which can, for example, be a drive control and/or navigation control of a self-driving vehicle or a robot control, wherein the control housing system additionally has at the second control sub-housing which contains a drive control and/or at least drive amplifiers which are designed, for example, to convert the drive commands provided by the drive control and/or by the navigation control or by the robot control into a drive power, by means of which the corresponding drive or drive motors of the wheels of the self-driving vehicle or drive motors of joints of a robot kinematic system are driven.

The object is accordingly also achieved by a self-driving vehicle having a control housing system according to one of the described embodiments and/or embodiment variants.

The self-driving and/or autonomous vehicle is preferably designed for driverless driving. To this end, the vehicle has a control device, which can also be referred to as a driving control. The control device also comprises a drive control which automatically controls and/or regulates the directions of rotation and the rotational speeds or possibly also the rotational accelerations and possibly also the steering position angle of the driven wheels of the vehicle, viz., depending upon the driving commands of the driving control. Besides the driven wheels, the vehicle can also comprise drive-less wheels which are not controlled by the control device, and are only rotatably mounted on the vehicle body of the vehicle, without being connected to a drive device or the drive control. The vehicle can, for example, be a driverless transport system (DTS). The self-driving and/or autonomous vehicle can in particular be part of a mobile robot, in which the vehicle forms a driving platform—in particular, an omnidirectional, drivable driving platform—on which an automatically controllable robot arm is arranged, in order to be able to change its installation position by driving the driving platform.

Each driven wheel can have a hub or an axle which is connected to a motor. In this respect, a separate motor can be associated with each individual wheel. The drive control drives the respective drivable wheel in that the drive control controls the respective motor, and the respective motor drives or brakes the corresponding wheel.

The driven wheels are normally rotatably mounted about a wheel axle on the vehicle body—in particular, on a chassis forming the vehicle body. In the case of omnidirectional wheels, apart from their being rotatably mounted about the wheel axle, these normally cannot be re-oriented or pivoted about another axis, i.e., the wheels are non-steerable wheels. Alternatively, the vehicle can also have steering wheels. In order to nevertheless navigate the vehicle with omnidirectional wheels and in particular turn it about its yaw axis, the omnidirectional wheels are operated at different rotational speeds. Depending upon the rotational speed differences, which can also include different directions of rotation, between one wheel and another, a resulting movement of the vehicle occurs. In particular, the vehicle can then also rotate or turn on the spot around its own vertical axis. A omnidirectional wheel vehicle also allows straight movements in the direction of the axes of rotation of the driven wheels, i.e., a lateral displacement of the omnidirectional wheel vehicle.

A specific embodiment of the invention is explained in more detail in the following description with reference to the accompanying figures. Specific features of this embodiment can represent general features of the invention regardless of the specific context in which they are mentioned, optionally also considered individually or in further combinations.

BRIEF DESCRIPTION OF THE DRAWINGS

The accompanying drawings, which are incorporated in and constitute a part of this specification, illustrate exemplary embodiments of the invention and, together with a general description of the invention given above, and the detailed description given below, serve to explain the principles of the invention.

DETAILED DESCRIPTION

Figure 1:
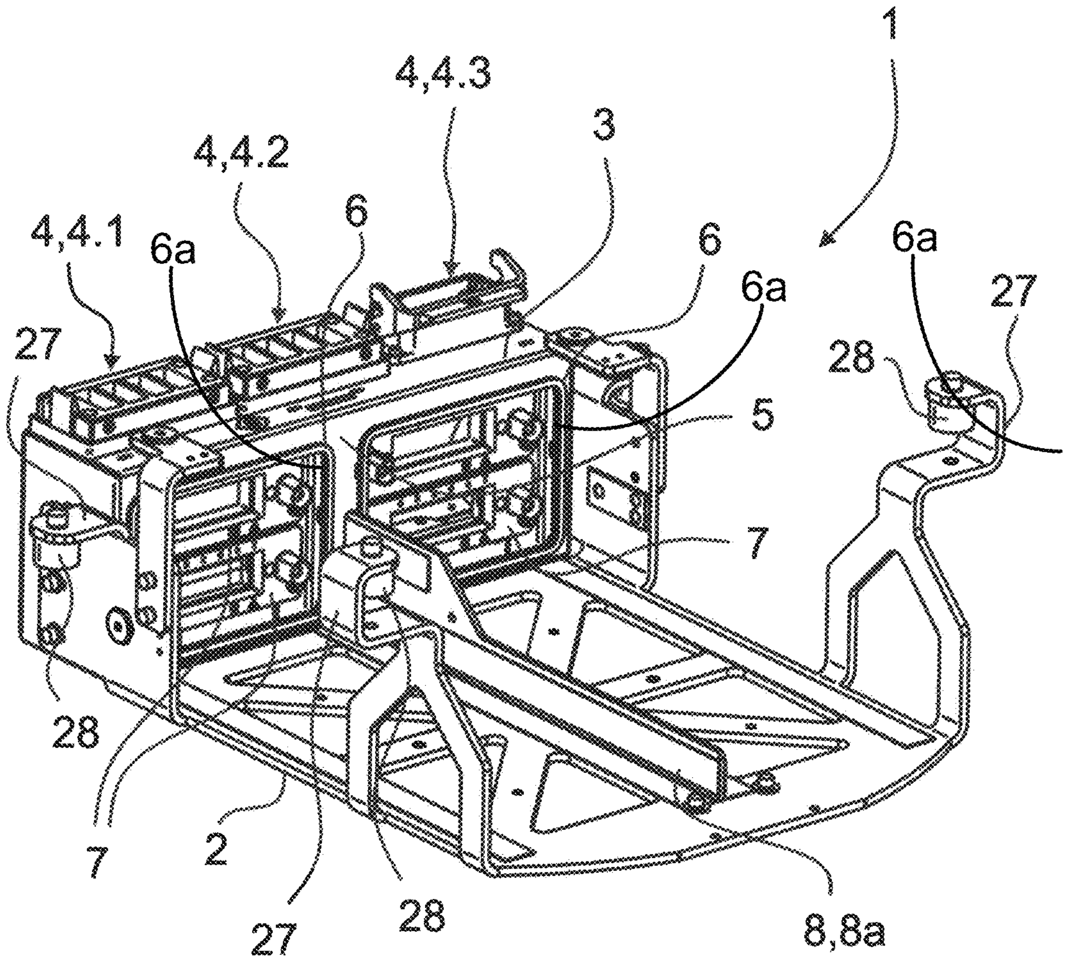
FIG. 1 shows a perspective view from the front of an exemplary embodiment of a control housing system according to the disclosure, with remote control sub-housings.

FIG. 1 shows a slide-in module support 2 of the control housing system 1 according to the disclosure, together with an interface chamber 3.

The interface chamber 3 is mechanically connected to slide-in module support 2. The interface chamber 3 comprises at least one cable feedthrough device 4. In the case of the present embodiment, the cable feedthrough device 4 comprises two separate cable gland devices 4.1 and 4.2 and an industrial connector 4.3. The interface chamber 3 comprises a coupling wall 5 which has a circumferential seal device 6, within the circumference of which at least one electrical mating connector 7 of the interface chamber 3 is positioned.

Figure 3:
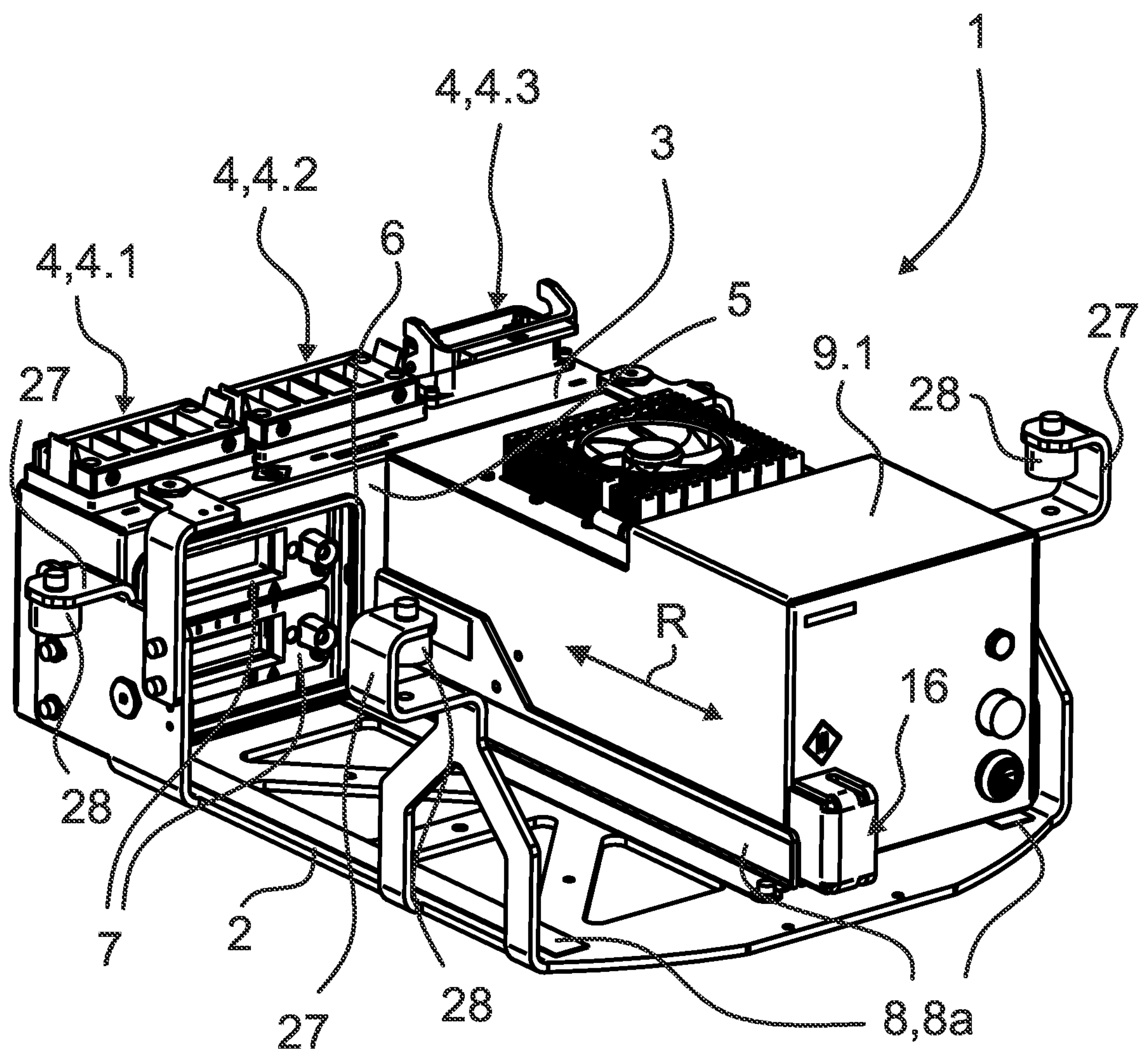
FIG. 3 shows a perspective view of the control housing system according to FIG. 1 with an inserted first control sub-housing which contains an electronic control device.
Figure 4:
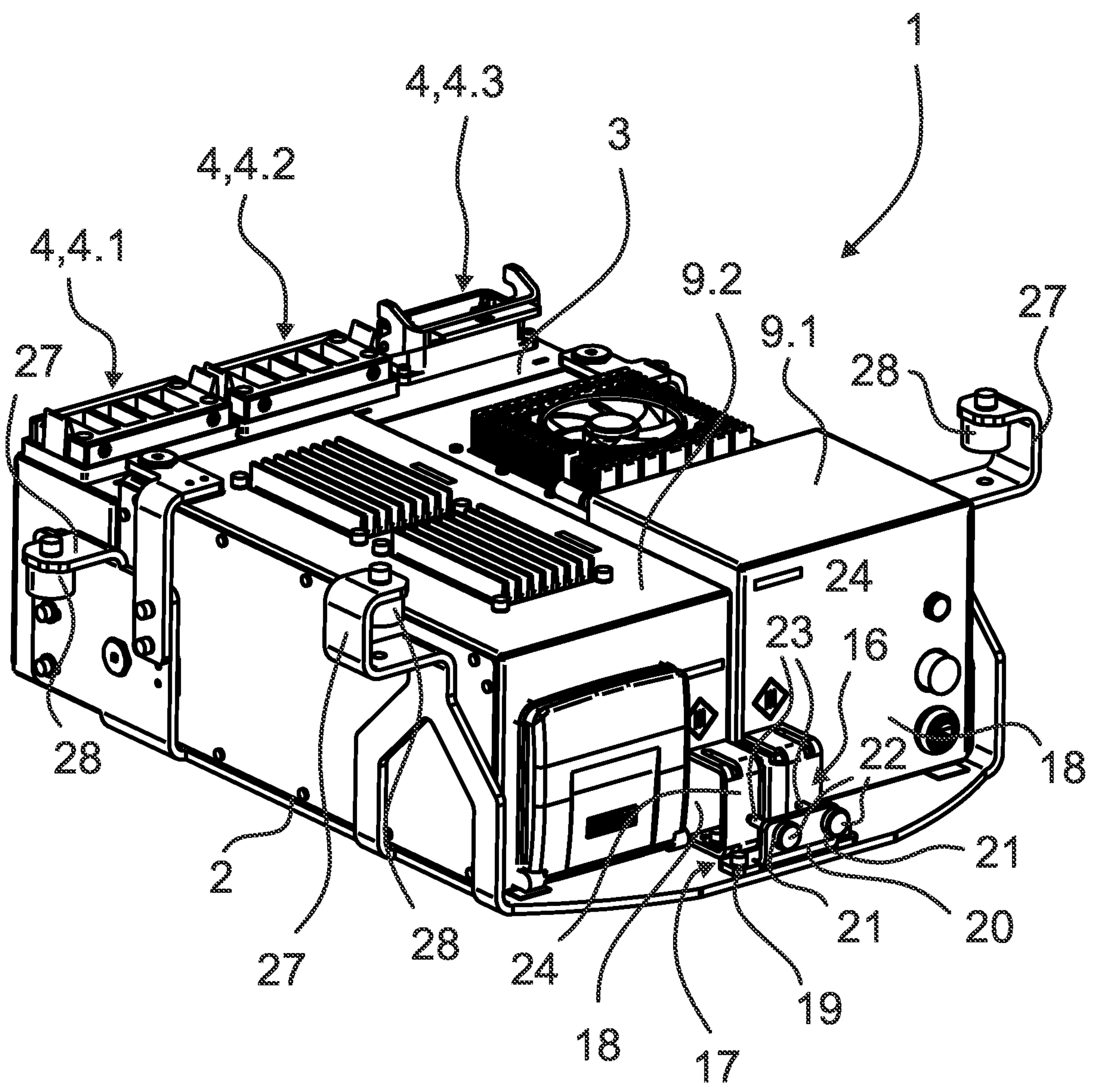
FIG. 4 shows a perspective view of the control housing system according to FIG. 1, wherein both a first control sub-housing, which contains an electronic control device, and a second control sub-housing, which contains a drive amplifier of a drive controller, are inserted.

The slide-in module support 2 has a guide device 8 which is designed to mechanically guide at least one control sub-housing 9.1, 9.2 (FIG. 3, FIG. 4). The respective control sub-housing 9.1, 9.2 is guided, by the guide device 8, between a decoupled position on the slide-in module support 2 in which the at least one electrical plug connector 10 is unplugged, and a coupled position on the slide-in module support 3 in which the at least one electrical plug connector 10 is plugged into the mating connector 7.

Figure 2:
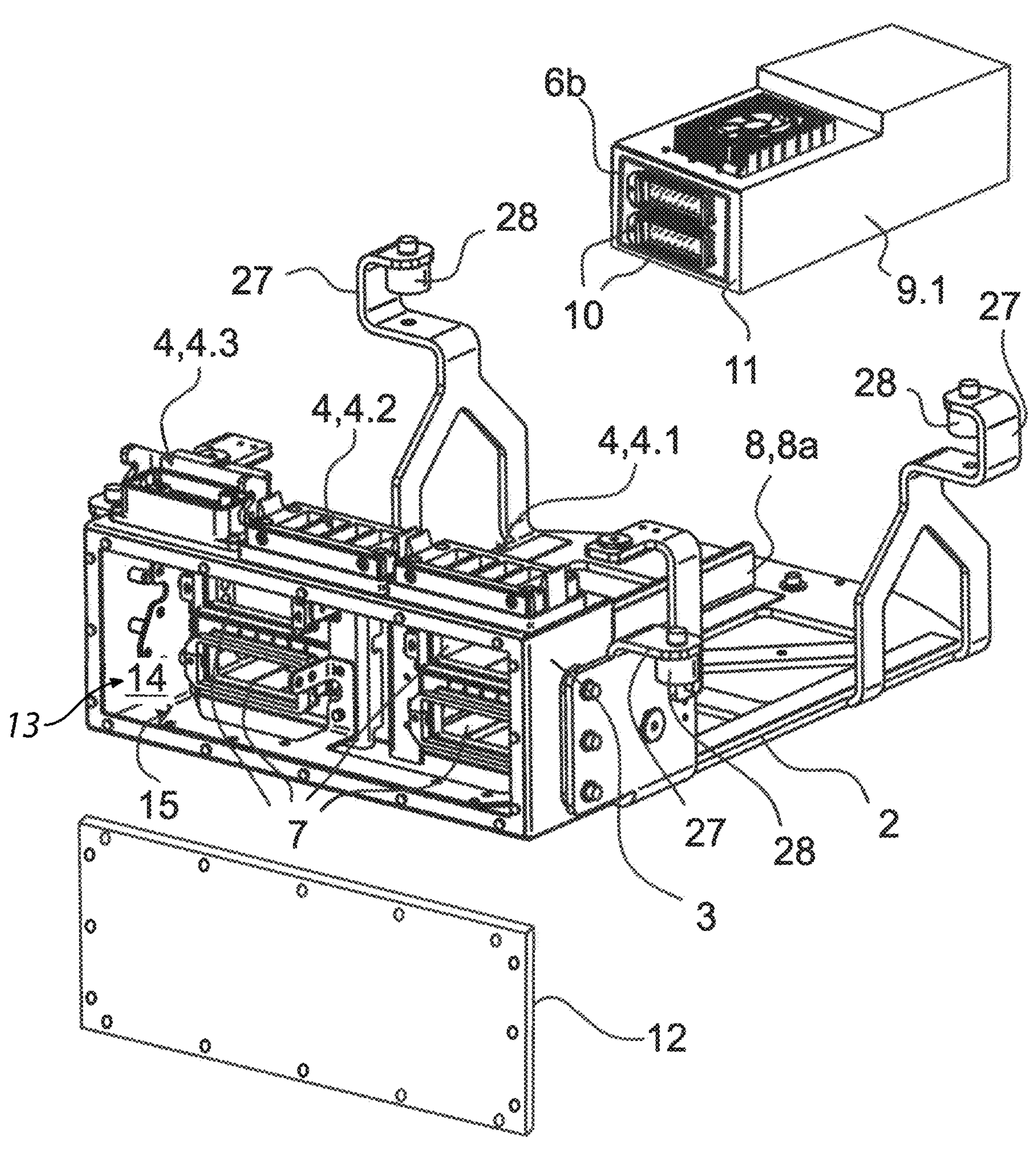
FIG. 2 shows a perspective view from the rear of the control housing system according to FIG. 1, with remote control sub-housings.

Accordingly, the respective control sub-housing 9.1, 9.2 has a housing rear wall 11 which carries the at least one electrical connector 10, as shown in FIG. 2. In the position of the control sub-housing 9.1, 9.2 in which it is coupled to the slide-in module support 3, the electrical connector 10 is plugged into the corresponding electrical mating connector 7 of the interface chamber 3. The housing rear wall 11 of the control sub-housing 9.1, 9.2 rests sealingly against the peripheral seal device 6 of the coupling wall 5 of the interface chamber 3.

As shown in particular in FIG. 2, the interface chamber 3 also has a mounting opening 13 which can be sealingly closed by a cover 12 and via which an interior 14 of the interface chamber 3 is accessible when the cover 12 is removed as shown in FIG. 2.

In the case of the shown embodiment, the sealing device 6 of the coupling wall 5 of the interface chamber 3 comprises a seal 6a attached to the coupling wall 5, which is arranged in an edge region of an opening 15 of the coupling wall 5, wherein the mating connector 7 of the interface chamber 3 is accessible via the opening 15 for inserting the electrical plug connector 10 of the control sub-housing 9.1, 9.2 into the mating connector 7 of the interface chamber 3. On the other hand, the housing rear wall 11 of the control sub-housing 9.1, 9.2 has a sealing seat surface 6b which interacts with the seal 6a of the coupling wall 5 in the coupled position of the control sub-housing 9.1, 9.2.

Alternatively, however, the seal device 6 of the coupling wall 5 of the interface chamber 3 can also comprise a sealing seat surface formed at the coupling wall 5, which is arranged in an edge region of an opening 15 of the coupling wall 5, wherein the mating connector 7 of the interface chamber 3 is accessible via the opening 15 for inserting the electrical plug connector 10 of the control sub-housing 9.1, 9.2 into the mating connector 7 of the interface chamber 3. In this case, the housing rear wall 11 of the control sub-housing 9.1, 9.2 then has a seal which interacts with the sealing seat surface of the coupling wall 5 in the coupled position of the control sub-housing 9.1, 9.2.

Each electrical mating connector 7 of the interface chamber 3 can be mounted so as to be adjustable relative to the coupling wall 5 in a plane parallel to the coupling wall 5.

Among other things, FIG. 3 shows the guide device 8 as it comprises at least one rail 8a, on which the respective control sub-housing 9.1, 9.2 is mounted for linear displacement in a direction R perpendicular to the plane of the coupling wall 5 of the interface chamber 3 between a decoupled position on the slide-in module support 2, in which the at least one electrical connector 10 is unplugged, and the coupled position on the slide-in module support 2, in which the at least one electrical connector 10 is plugged into the respective mating connector 7.

Especially FIG. 4 shows how the slide-in module support 2 can have at least one clamping means 16, which is designed to fix the control sub-housing 9.1, 9.2 in its coupled position on the slide-in module support 2, in which the electrical connector 10 of the control sub-housing 9.1, 9.2 is plugged into the mating connector 7 of the interface chamber 3, and/or to clamp it tight by pressing against the seal 6a and/or the seal seat surface 6b in the direction of insertion.

For this purpose, the clamping means 16 can have a pressing device 17 which is arranged on a housing front wall 18 of the respective control sub-housing 9.1, 9.2 opposite the housing rear wall 11 of the control sub-housing 9.1, 9.2, and is supported on a section 19 of the slide-in module support 2 there. As shown in the shown embodiment, a tab 20 can be fastened to the slide-in module support 2 upstream of the housing front wall 18 of the control sub-housing 9.1, 9.2 and has a respective threaded hole 21 in which a respective screw 22 aligned perpendicularly to the plane of the housing rear wall 11 of the control sub-housing 9.1, 9.2 or perpendicularly to the plane of the coupling wall 5 of the interface chamber 2 is screwed. The thread-side end face 23 of the screw 22 can press directly and indirectly against the housing front wall 18 of the control sub-housing 9.1, 9.2 via interposed spacers or clamps 24 when the screw 22 is screwed in. By screwing in the screw 22, the control sub-housing 9.1, 9.2 is guided on the guide device 8 of the slide-in module support 2 with its housing rear wall 10 pressed or pretensioned against the coupling wall 5 of the interface chamber 3.

Figure 5:
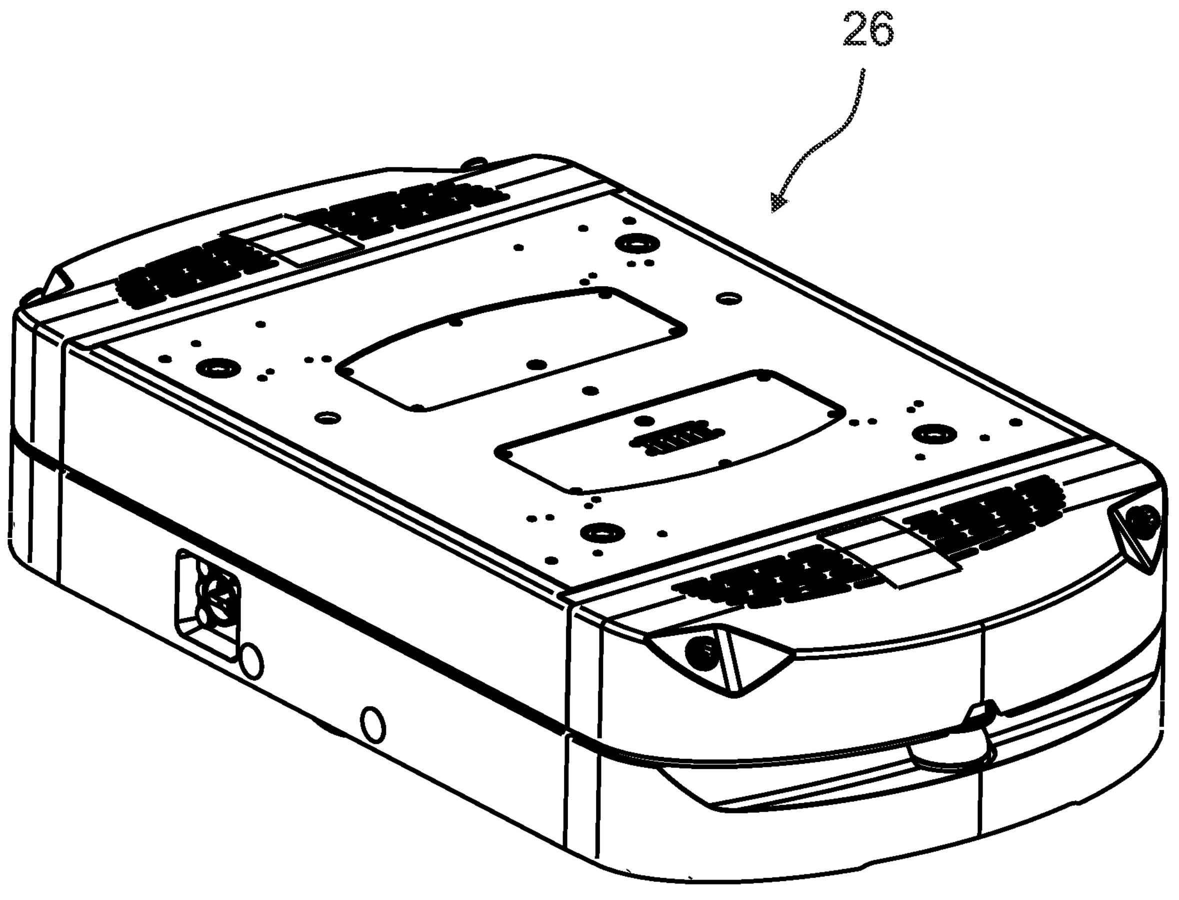
FIG. 5 shows a perspective view of an exemplary self-driving vehicle which contains a control housing system in accordance with the disclosure.

In the case of the present embodiment, the slide-in module support 2 has damping bodies 25 by means of which the slide-in module support 2 can be mounted in a vibration-dampened manner on a frame or a chassis—for example, of a vehicle 26 (FIG. 5). For this purpose, support arms 27 or support brackets can be formed on the slide-in module support 2, which have support sections which comprise the downwardly facing seat surfaces on which an elastic damping body 28 is fastened in each case. In an installed state of the slide-in module support 2 in the device or the machine, such as for example the vehicle 26, the undersides of the elastic damping bodies 28 lie on support surfaces of the frame or the chassis of the device or the machine, such as for example the vehicle 26, wherein the slide-in module support 2 in this respect rests on the elastic damping bodies 28.

In the case of the shown exemplary embodiment, the control housing system 1 comprises a first control sub-housing 9.1 with at least one first housing rear wall 11, which carries at least one first electrical connector 10, wherein the first control sub-housing 9.1 contains an electronic control device. The shown control housing system 1 also comprises a second control sub-housing 9.2 having a second housing rear wall 11, which carries at least one second electrical connector 10, wherein the second control sub-housing 9.2 contains a drive amplifier of a drive control.

The control housing system 1 together with the electronic control device and the drive amplifiers or the drive control can be contained in a self-driving vehicle 25, as shown by way of example in FIG. 5.

While the present invention has been illustrated by a description of various embodiments, and while these embodiments have been described in considerable detail, it is not intended to restrict or in any way limit the scope of the appended claims to such detail. The various features shown and described herein may be used alone or in any combination. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit and scope of the general inventive concept.

What is claimed is:

1. A control housing system, comprising:

at least one control sub-housing including at least one housing rear wall that supports at least one electrical connector;

a slide-in module support having a guide device configured to mechanically guide the control sub-housing between a decoupled position on the slide-in module support, in which the at least one electrical connector is unplugged, and a coupled position on the slide-in module support, in which the at least one electrical connector is plugged in; and an interface chamber mechanically connected to the slide-in module support, the interface chamber including:

at least one cable feedthrough device for receiving at least one electrical line therethrough into the interface chamber, at least one coupling wall which faces the housing rear wall of the at least one control sub-housing in the coupled position, the at least one coupling wall including a circumferential seal device, at least one electrical mating connector disposed within a circumference of the circumferential seal device, and configured complementary to the at least one electrical connector of the control sub-housing, and a mounting opening which can be selectively closed in a sealing manner by a cover, the mounting opening providing access to an interior of the interface chamber when the cover is removed therefrom;

wherein, in the coupled position of the control sub-housing on the slide-in module support, the at least one electrical connector is plugged into the corresponding electrical mating connector of the interface chamber, and the housing rear wall is sealingly seated against the circumferential seal device of the coupling wall.

2. The control housing system of claim 1, wherein:

the circumferential seal device of the coupling wall comprises a seal attached to the coupling wall and arranged in an edge region of an opening in the coupling wall;

the at least one electrical mating connector of the interface chamber is accessible through the opening in the coupling wall; and the at least one housing rear wall includes a sealing seat surface cooperating with the seal attached to the coupling wall in the coupled position of the control sub-housing on the slide-in module support.

3. The control housing system of claim 1, wherein:

the circumferential seal device of the coupling wall comprises a sealing seat surface formed at the coupling wall and arranged in an edge region of an opening in the coupling wall;

the at least one electrical mating connector of the interface chamber is accessible through the opening in the coupling wall; and the at least one housing rear wall includes a seal cooperating with the sealing seat surface of the coupling wall in the coupled position of the control sub-housing on the slide-in module support.

4. The control housing system of claim 1, wherein the at least one electrical mating connector is adjustably mounted relative to the at least one coupling wall in a plane parallel to the coupling wall.

5. The control housing system of claim 1, wherein the guide device comprises at least one rail on which the control sub-housing is mounted for linear displacement in a direction perpendicular to the plane of the coupling wall between the decoupled position and the coupled position on the slide-in module support.

6. The control housing system of claim 1, wherein the slide-in module support comprises at least one clamp configured to at least one of:

fix the control sub-housing in the coupled position on the slide-in module support; or clamp the control sub-housing tight by pressing against at least one of the seal or the sealing seat surface in a direction of insertion between the decoupled and coupled positions.

7. The control housing system of claim 1, wherein the cable feedthrough device comprises at least one of:

at least one cable gland device; or at least one industrial connector.

8. The control housing system of claim 1, wherein:

the interface chamber has a dust-tight and/or liquid-tight interior; and at least one of: a) electrical line sections of at least one electrical line fed through the at least one cable feedthrough device, or b) at least one electrical connection cable which electrically connects at least one industrial connector to the electrical mating connector, are arranged in the interface chamber interior.

9. The control housing system of claim 1, wherein the at least one control sub-housing comprises:

at least one first control sub-housing with at least one first housing rear wall that carries the at least one first electrical connector, the at least one first control sub-housing containing an electronic control device; and at least one second control sub-housing with at least one second housing rear wall that carries at least one second electrical connector, the at least one second control sub-housing containing drive amplifiers of a drive control.

10. A self-driving vehicle having a control housing system according to claim 1.

* * * * *